US008338219B2

(12) United States Patent
Mazzillo

(10) Patent No.: US 8,338,219 B2
(45) Date of Patent: Dec. 25, 2012

(54) MULTIPLEXED OUTPUT TWO TERMINAL PHOTODIODE ARRAY FOR IMAGING APPLICATIONS AND RELATED FABRICATION PROCESS

(75) Inventor: Massimo Cataldo Mazzillo, Corato (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/534,801

(22) Filed: Jun. 27, 2012

(65) Prior Publication Data
US 2012/0270360 A1    Oct. 25, 2012

Related U.S. Application Data

(62) Division of application No. 12/895,081, filed on Sep. 30, 2010, now Pat. No. 8,264,019.

(30) Foreign Application Priority Data

Oct. 2, 2009  (IT) .............................. VA2009A0062

(51) Int. Cl.
  *H01L 21/00*    (2006.01)
(52) U.S. Cl. ............ 438/73; 438/92; 257/284; 257/287; 257/286; 257/285

(58) Field of Classification Search .......... 257/280–287; 438/73, 92
See application file for complete search history.

(56) References Cited

U.S. PATENT DOCUMENTS

| 5,751,159 | A | 5/1998 | Holm et al. |
| 2007/0257283 | A1 | 11/2007 | Chyan et al. |
| 2011/0156682 | A1 | 6/2011 | Girdhar et al. |
| 2011/0266691 | A1 | 11/2011 | Lin et al. |

FOREIGN PATENT DOCUMENTS

EP    1995793    11/2008

OTHER PUBLICATIONS

Laih et al., "Characteristics of MSM photodetectors with trench electrodes on P-type Si wafer", IEEE Transactions on Electron Devices, vol. 45, No. 9, Sep. 1998, pp. 2018-2023.

*Primary Examiner* — Telly Green
(74) *Attorney, Agent, or Firm* — Allen, Dyer, Doppelt, Milbrath & Gilchrist, P.A.

(57) ABSTRACT

A detector array for an imaging system may exploit the different sensitivities of array pixels to an incident flux of low energy photons with a wavelength falling near the high end of the range of sensitivity of the semiconductor. The detector array may provide the de-multiplexable spatial information. The detector array may include a two-terminal multi-pixel array of Schottky photodiodes electrically connected in parallel.

16 Claims, 18 Drawing Sheets

MULTIPLEXED OUTPUT TWO TERMINAL PHOTODIODE ARRAY FOR IMAGING APPLICATIONS AND RELATED FABRICATION PROCESS

RELATED APPLICATIONS

This application is a divisional of pending Ser. No. 12/895,081 filed Sep. 30, 2010, the entire disclosure of which is hereby incorporated herein by reference.

FIELD OF THE INVENTION

The invention relates generally to imaging systems. In particular, the invention relates to a multi-pixel detector array for use in an imaging system and a method of fabricating the same.

BACKGROUND OF THE INVENTION

Detector arrays are used in a wide variety of imaging systems for industrial as well as scientific applications. For example, detector arrays have been recently widely used in nuclear medical imaging techniques, such as Positron Emission Tomography (PET). In such an application 511 keV gamma rays emitted from a human body strike pixelated scintillators which create light in response to the received radiation. Each illuminated pixel of the pixelated scintillator is detected by a respective photodiode of the detector array that converts the light into electrical signals used for imaging purposes. During data collection, each pixel provides an electrical output signal proportional to the absorbed photon flux. These output signals are then processed to create an image of the internal features of the subject (See M. Mazzillo et al., Silicon Photomultipliers for Nuclear Medical Imaging Applications, Proc of SPIE, Optical Sensors 2008, Vol. 7003 70030I-1).

Schottky photodiodes are majority carrier devices, and as such, they may be preferred because they allow a faster timing response than conventional p-n junctions. In Trench Sidewall Contact Schottky Photodiode and related method of fabrication, VA2009A000033, filed Jun. 1, 2009 to M. C. Mazzillo, a vertical Schottky photodiode structure is disclosed. The thickness of the depleted region of which is adjusted by varying the depth of metal contact trenches in a lightly doped semiconductor epilayer, and even the thickness of the epilayer may be reduced to trim the sensitivity of the device to high wavelength photons.

Of course, single pixels or photo detector arrays, including Schottky photodiodes, can be used for detecting the radiation without using any scintillator material, as, for example, in spectroscopic and astronomical imaging applications where the electromagnetic radiation to be detected is in the range of sensitivity of the semiconductor used for the photo sensor fabrication.

Charged Coupled Device (CCD) technology is commonly used for imaging applications due to its relatively high quantum efficiency in the visible band and low readout noise, even at relatively high scan rates. In recent years CMOS-Active Pixel Sensors (APS) have been developed and used for high speed imaging applications, for example, in adaptive optics, star trackers, and fast video-rate readout systems. Though CCD devices exhibit better performance in terms of high fill factor and, consequently, high quantum efficiency and low noise, CMOS APS devices may be more used because of their superior response performances, low fabrication cost, and easy foundry access (See G. Bonanno et al., CMOS-APS for Astrophysical Applications, Memorie Salt 2003, Vol. 74, pp. 800-803).

A great effort has been recently spent for the realization of SPAD (Single Photon Avalanche Diode) imaging arrays, which by exploiting the faster time response (<100 ps) of photodiodes allow a three-dimensional imaging of the objects by using time-of-flight techniques. The packaging of these devices and the integration of the detector with the ancillary electronics is a quite complex matter, and lately various techniques have been developed to realize compact and cheap "packaging" approaches.

In any case, large area and high fill factor arrays may be desired. The pixels of which should be individually addressable by independent driving and readout circuits. The larger the number of pixels in the array the greater the dynamic range, and thus the more accurate the spatial information provided by the whole photo detector. Indeed, the larger the size and the geometrical fill factor of the array, the greater its sensitivity.

According to semiconductor device fabrication processes, chips are built up in large numbers on a single large "wafer" of semiconductor material, typically silicon. The individual chips are patterned with small pads of metal (usually near their edges) for connections to leads of a metal frame. The chips are then cut out of the wafer bonded to a metal frame or carrier, and the pads are connected to the metal leads, typically with small wires (wire bonding). In case of a multi-pixel array, an individual connection of each array pixel to an external circuitry may be desired, and for arrays with a large number of pixels wire bonding may become practically impossible because of packaging constraints.

A possible approach to overcome this problem may be to integrate the sensor and the electronics in a compatible technology process flow such that by integrating complex multiplexed electronics architectures, the overall number of external leads may be made compatible with the packaging constraints of evidence. However, this approach significantly reduces the area occupancy ratio between sensing area and overall chip area (geometrical fill factor) limiting the dynamic range and/or sensitivity (See Niclass et al., Design and Characterization of a CMOS 3-D Image Sensor Based on Single Photon Avalanche Diodes, IEEE Journal of Solid-State Circuits, Vol. 40, No. 9, pp. 1847-1854, 2005). Moreover, it may not be possible to integrate the electronics and the photo sensor fabrication technologies in a monolithic device fabrication process.

Integration of a detector array with ancillary electronics may be made possible by using more complex packaging techniques like "Flip Chip" or "Bridge" Bonding. Both contemplate bonding of two distinct chips face-to-face and illuminating the detector array from the substrate side (so-called back illumination). In Flip Chips the semiconductor detector cells are "bump-bonded" to readout circuits by defined arrays of indium (In) or solder bumps. Such a technique has been used, for example, for indium-gallium-arsenide (InGaAs) photodiodes grown epitaxially on indium-phosphide (InP) substrates. In this case, the substrate material is relatively transparent at the wavelength where the epitaxially thick detector is used so that the devices can be used in back-illuminated mode without eliminating the substrate onto which they were formed. However, in other situations, for example, in homo-epitaxial devices realized on silicon or on silicon carbide, the substrate is optically opaque at wavelengths the detector has to be used, and therefore, it may be desirable to remove the substrate leaving a detector structure that may be only a few microns thick. In such a "bumpbonding" process, a sufficient mechanical sturdiness may be ensured by filling the spaces between the bumps before detector substrate removal. Concerns about the scalability of this type of process to large array sizes led to the development of an alternative process known as "bridge bonding" (See B. F. Aull et al., Geiger-Mode Avalanche Photodiodes for Three-Dimensional Imaging, Lincoln Laboratory Journal, Vol. 13, No. 2, pp. 335-350, 2002).

In a "bridge bonding" process, the detector array and the electronics chips are epoxied together, and detector substrate removal is carried out. Electrical connections are made last by etching vias between the photodiodes and patterning metal connections in the vias. Successful development of the bridge-bonding process required overcoming a number of technological hurdles. First of all, the thinning must be uniform. Then curing of the epoxies used must not lead to destructive mechanical stresses due to thermal-expansion coefficient mismatch between semiconductors and epoxies. The vies through the epoxy must have sloped sidewalls to allow good step coverage of the bridge metal. Moreover because of the vias, most of the required photolithographic steps are done on a non-planar surface, which raises some problems of non-uniform photo resist thickness and exposure depth-of-focus issues. Finally, handling of the photo detector wafer should not lead to excessive increases in leakage current or dark count rate (See B. F. Aull et al., Geiger-Mode Avalanche Photodiodes for Three-Dimensional Imaging, Lincoln Laboratory Journal, Vol. 13, No. 2, pp. 335-350, 2002).

A possible way to front illuminate the detector for avoiding removal of the substrate is to use Through Silicon Vies (TSVs) for the integration of the detector with the electronics. TSV is a vertical electrical connection (via) passing completely through a silicon wafer or die, and at present, may potentially be the best technique of system integration. In this case, the detector die and the electronics chips are vertically stacked, and the contacts from the topside of the detector are realized through vias to the backside of the die, then suitably soldered to the driving and readout circuitry.

The through-via technology made remarkable advances in the latter half of the 90 s, when important process technologies, such as deep silicon etching, wafer thinning, and wafer/chip bonding were developed. However, high cost of these techniques make them unsuited for low-end products (See K. Takahashi and M. Sekiguchi, Through Silicon Via and 3-D Wafer/Chip Stacking Technology, 2006 Symposium on VLSI Circuits, pp. 89-92).

SUMMARY OF THE INVENTION

Multiplexing of array pixel information to communicate with the external world through a limited number of leads of a semiconductor integrated sensor device, may be accomplished in an increasingly effective and efficient manner in the multi-pixel, photo detector array in accordance with the present embodiments.

The sensing structure of the multi-pixel, photo detector array of the present disclosure may be a Schottky photodiode having a distributed anode contact buried in the bulk of a semiconductor layer, in the form of metal filled trenches and/or holes, uniformly spaced from one another and generally distributed at regular intervals within the respective pixel sensing area. The Schottky photodiode structure may have an integrated structure similar to the one disclosed in prior Italian patent application No. VA2009A000033, of the same applicant, filed on Jun. 1, 2009, the entire content of which is herewith incorporated by reference.

An important aspect of the novel multi-pixel, photo detector array is that the parts or portions of the distributed anode contact of the distinct elementary sensing structures of the multi-pixel array may be connected to a common anode current collecting grid contact, patterned in a front metallization layer in a way as to have a reduced foot-print over the whole front area of the photo detector array, and the elementary sensing structures of the multi-pixel array may share a common cathode contact.

Thus, such a two-terminal, multi-pixel, photo detector array may multiplex the individual pixel information through a common anode and a common cathode contact.

Discrimination among the information coming from the array pixels in terms of wavelength of the incident radiation may be possible by adapting the depth and the spacing of the Schottky metal filled trenches and/or holes of the distributed anode contact in the semiconductor of each elementary Schottky diode of the array to produce a unique depth (thickness) of the depletion layer and/or a unique pinch-off condition, at least one of which is, in general, significantly different from that of any other Schottky diode of the array at a given wavelength of the incident photons.

The effectiveness of such a modulation of these fundamentally geometric parameters in determining the resulting depth of the profile (thickness) of the depletion layer (i.e. of the sensible photon absorption region in the semiconductor) and the pinch-off condition of depletion regions produced around the uniformly spaced Schottky metal/semiconductor trench contacts of the each pixel photodiode (i.e. corresponding to its maximum detection efficiency condition) has been found to be substantially equivalent for a variety of commonly used semiconductors. By properly designing the geometrical aspect ratio and spacing of the metal filled trenches, it may be retained also at very low reverse bias condition of the diodes and even at null bias, that is under purely photovoltaic regime.

The array may be particularly suited for imaging applications with monochromatic or substantially so photons of wavelength falling in the low energy (high wavelength) end of the range of sensitivity of the semiconductor used for the fabrication of the multi-pixel array sensor.

It may be well known that in any semiconductor material the photon absorption coefficient decreases with the wavelength (See, for example, H. Y. Cha and P. M. Sandvik, Electrical and Optical Modeling of 4H-SiC Avalanche Photodiodes, Japanese Journal of Applied Physics, Vol. 47, No. 7, pp. 5423-5425, 2008, and S. M. Sze, Semiconductor Devices Physics and Technology, New York: Wiley, 1985). At 350 nm, for instance, the "absorption length" in 4H-SiC is about 35 µm, meaning that 67% of the incident optical flux at this wavelength is absorbed in an active layer (a depleted semiconductor region) 35 µm thick (See J. Hu et al., 4H-SiC Visible-Blind Single-Photon Avalanche Diode for Ultraviolet Detection at 280 and 350 nm, IEEE Transactions on Electron Devices, Vol. 55, No. 8, pp. 1977-1982, 2008). This means that it may be generally necessary to increase as much as required or possible, the thickness of the active region (i.e. the depth of the depleted region in the semiconductor) to enhance absorption, and consequently, photon detection effectiveness at the long wavelength end of the sensitivity range of the semiconductor. The ability to grow lightly doped semiconductor epilayers of low defectivity and of relatively large thickness, in the order of several tens of µm, and the ability to etch deep trenches with a high aspect ratio in a semiconductor epilayer and to fill them with a high Schottky barrier metal, may make it relatively easy to adapt the geometric parameters that determine the operative thickness (depth) of the depletion layer amongst the Schottky photodiode structures of individual array pixels (i.e. designing the geometry of the photodiode of each pixel for a unique response to illumination with photons of a given wavelength).

A relatively light doping of a semiconductor epilayer, in which the array of Schottky photodiodes is formed, may promote the creation of wide depleted regions already at very low reverse bias condition of the diodes. By suitably designing the distance among adjacent trenches, the pinch-off condition, corresponding to the condition of fullest detection effectiveness, may be achieved with a relatively low reverse bias and may be even in photovoltaic regime (0 V bias of the photodiode).

Exemplary ways of how a multi-pixel, photo detector array of the applicant may be fabricated with ordinary and relatively inexpensive integration process techniques will be illustrated in the ensuing description, without intending to limit the breath of protection to the illustrated embodiments.

DETAILED DESCRIPTION OF THE PREFERRED EMBODIMENTS

Figure 1:
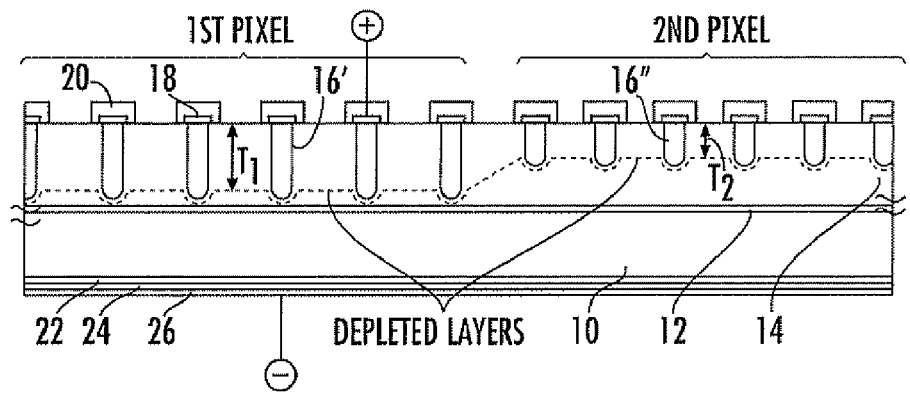
FIG. 1 is a schematic cross section of two adjacent pixels of a photo detector array according to the present embodiments.

The novel architecture of multi-pixel photo detector array of Schottky photodiodes for imaging applications with substantially monochromatic radiations of wavelength comprised in a high wavelength end portion of the sensitivity range of the semiconductor used is schematically depicted in FIG. 1.

According to the considered exemplary embodiment, FIG. 1 shows a vertical cross-sectional view of two adjacent pixels of the array. Alike are the two pixels, $1^{ST}\_{PIXEL}$ and $2^{ND}\_{PIXEL}$, shown in the descriptive fragment of the cross-sectional view of FIG. 1. The pixel photodiodes are formed in a lightly doped, $n^{--}$ type layer 14, epitaxially grown over a relatively thin moderately doped, $n^{-}$ type buffer layer 12, on a heavily doped, $n^{+}$ type mono crystalline substrate 10. The cathode contact-terminal pad of the array is common to all the pixels and may be formed by a commonly, not patterned, metal layer or, more typically, a multilayer metal stack, 22, 24 and 26, deposited over the rear surface of the mono crystalline semiconductor wafer of substrate 10.

One pixel photodiode $1^{ST}\_{PIXEL}$ has trenches filled with high barrier Schottky metal 16', usually tungsten or aluminum, all of identical depth that may be uniformly spaced from one another throughout the active area projection of the diode, and different, from the depth and uniform spacing of the metal filled trenches 16" of the other photodiode $2^{ND}\_{PIXEL}$. As a consequence, the depletion layers' profiles of the two photodiodes, traced with a dotted line, are different and substantially the useful photon absorption region in the semiconductor epilayer 14, assumes different depths (thicknesses), namely: $T_1$ and $T_2$, respectively, in the two array pixels.

In the ensuing description, it is presumed that the photons impinge on only one pixel of the array at the time. That is, only one pixel at the time is impinged by photons. In practice, the flux of photons has a cross-section sufficiently small to excite a single pixel.

For example, in an array of scintillation detectors an elementary particle (a gamma ray) is absorbed by only one detector at the time. When the detector absorbs an elementary particle, it emits a photon. By associating a pixel of the array to each scintillation detector, it may be possible to identify the detector that has captured the elementary particle by recognizing, in terms of relative intensity of response, the pixel that captured the emitted photon.

If a flux of relatively long wavelength monochromatic photons impinges on the active surface area of these array pixels, the number of pairs of electrical carriers that are generated in the depleted layer of each pixel upon absorption of photons will be different because the degree of absorption depends from the thickness of the sensitive depletion region in the semiconductor. In other words, the number of pairs of electrical carriers may be different from different absorption characteristics of each photodiode of the array.

Therefore, spatial information may be provided for any specific wavelength of the flux of energetic photons by the different electro-optical response of each pixel to an impinging monochromatic photon flux, and this may relieve the need of providing an independent output for each pixel of the array, as in comparable photo detector arrays for imaging of the prior art.

In other words, the pixels connected to a same anode line generate different photocurrents in response to the absorption of a photon. Therefore, by reading the current collected on the anode line, it may be possible to identify the pixel that has captured the photon.

Figure 2:
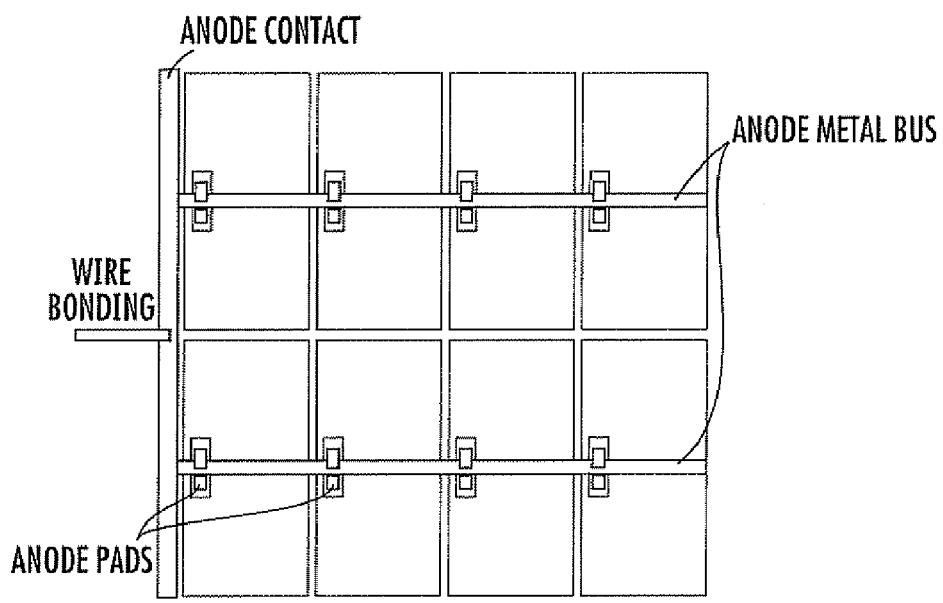
FIG. 2 is a diagram of an exemplary layout of a 4×4 multi-pixel photo detector array having different pixel structures, as shown in FIG. 1.

The distributed anode trench contacts 16', 16", etc. of the Schottky photodiodes of the pixels $1^{ST}\_{PIXEL}$, $2^{ND}\_{PIXEL}$, etc. of the photo detector array can be connected to a common patterned metal anode collecting grid 18. This is schematically depicted in FIG. 2 for an exemplary 4×4 photo detector array, wherein two parallel anode metal buses, to which the distributed anode trench contacts 16', 16", etc. of the Schottky photodiodes of the pixels are connected, lead to a unique anode terminal pad of the two-terminal, multi-pixel photo detector array of this disclosure.

The novel two terminal array architecture of this disclosure may be alternatively formed even with both the anode and the cathode grid contacts patterned in the same front metallization layer, for example, in the form of two interleaved multibus collector/distributor, metal patterned structures. In this case, the fabrication process flow provides for bringing to the front surface, the common cathode contact of each pixel photodiode through the lightly doped epilayer without creating spurious rectifying metal/semiconductor contacts therewith.

The possibility of forming a multi-pixel, photo detector array with one (two-terminal) output, or even with two outputs (three or four terminals), by multiplexing all the array pixels or the pixels of two distinct groups of array pixels, respectively, may offer the possibility of generating simultaneous images for two distinct wavelength, monochromatic photon fluxes of the same object or source surface. The groups of pixels may be, for example, a first order or group of pixels with individually differentiated response characteristics to photons of a first wavelength, and a second order or group of pixels with individually differentiated response characteristics to photons of a second wavelength sufficiently spaced from the first wavelength though falling both in the high wavelength portion of the spectrum of sensitivity of the semiconductor used. The multiplexing of the spatial information, besides reducing the number of leads, also entails a much simpler driving and readout circuitry of the imaging device, and this simplification may favor integration of the biasing and readout circuitries on the sensor chip, overcoming packaging problems and related costs of the imaging device.

Of course, in case of an array contemplating grouping of pixels in two distinct orders for simultaneous imaging with two distinct monochromatic photon fluxes of different wavelength, the pixels of the two orders may be similarly distributed over the sensor area (e.g. in pairs of adjacent pixels of the two orders) according to a pattern and a duplication of the respective common anode current collecting grid contact, patterned in the front metallization layer, one for each group of pixels.

In any case, the novel sensor device may offer a high fill factor because of the reduction of blind area not requiring a burdensome plurality of patterned metal lines for providing an independent anode output for each pixel. The advantage increases for arrays with a large number of pixels.

A light doping of the epitaxial layer allows reaching of the pinch off condition among the depletion regions that are created around each trench anode contact at relatively low reverse bias, by suitably designing the distance of separation (spacing) among adjacent metal-filled trenches of each pixel. Therefore, properly designed distributed anode trench contacts of the array pixels may work at fullest detection efficiency for high wavelength (low energy) photons under an extremely low reverse bias, and even at null bias (0V bias), in what may be defined purely photovoltaic regime.

The distributed Schottky metal electrode of each photodiode (typically tungsten or aluminum) set in uniformly spaced deep trenches reduces unwanted cross talk effects among adjacent array pixels, and among adjacent parts of the distributed Schottky contact of each elementary photodiode (pixel) reducing the probability that an absorbed photon may create two or more carrier pairs in the depleted semiconductor region. Thus a spurious gain enhancement may be produced that would in turn cause of error in the estimation of the photonic flux absorbed in the array pixel.

Figure 3:
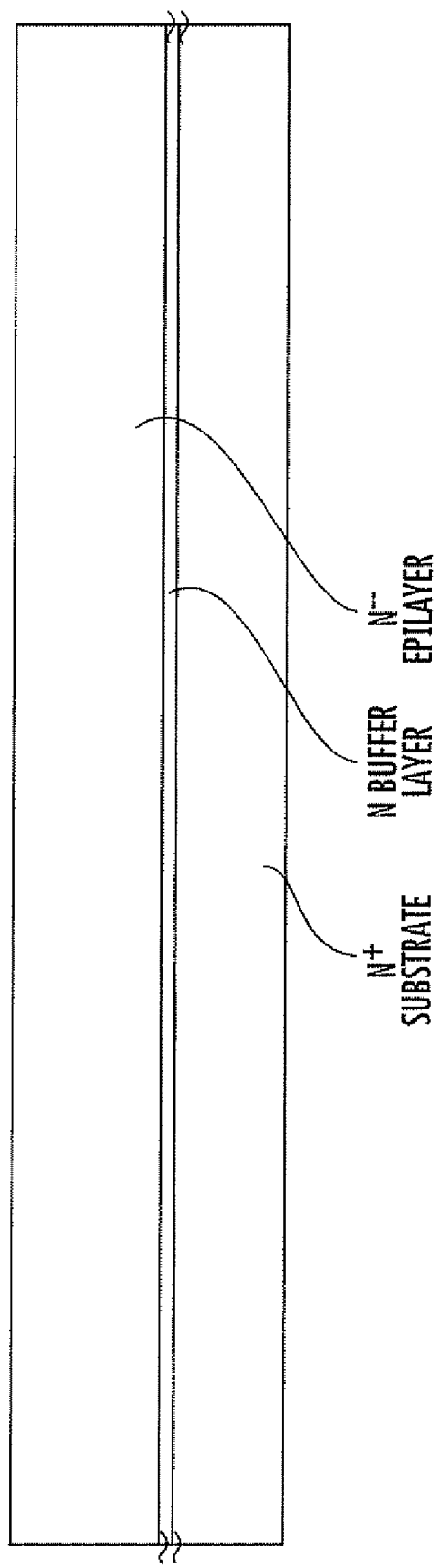
FIGS. 3-19 schematically illustrate a sequence of steps of a fabrication process of the multi-pixel photo detector array according to the present embodiments.

In the sequence of sectional fragments, from FIG. 3 to FIG. 19, the main steps of an exemplary fabrication process flow are illustrated and described herein below using the reference numerals used for describing the functional multi-pixel photo detector array structure of FIG. 1. The exemplary process flow may be followed for integrating a multi-pixel photo detector array of this disclosure on an N-type silicon, substrate 10, over which, according to common practice in the art, a first, thin N-type buffer layer 12 and a second, thick N-type layer 14 are epitaxially grown, as depicted in FIG. 3.

The dopant concentration of the substrate 10 may be in the range 1E18 to 1E19 atoms/cm$^3$, and the dopant concentrations of the thin epitaxial buffer layer 12 and of the thick epitaxial layer 14 may be in the ranges 1E17 to 1E18 atoms/cm$^3$ and 1E13 to 1E15 atoms/cm$^3$, respectively. The substrate 10 may have a thickness in the range 350-400 µm, the thin epitaxial buffer layer 12 a thickness in the range 0.5-1 µm, and the lightly doped thick epitaxial layer 14 a thickness in the range 3-150 µm.

The heavily doped substrate 10 may provide for establishing a non-rectifying (ohmic) cathode contact, common for all the array pixels, with an appropriate metallization of the whole rear surface of the substrate, connectable to a photo detector circuitry that can be on the same chip or even external to the photo detector array chip.

The thin epitaxial layer 12 acts as buffer layer on which the thick lightly doped epilayer 14 may be more reliably grown. The light doping of the thick N$^{--}$ epitaxial layer 14 promotes the creation of relatively wide space charge (i.e. depleted) regions that enhance collection efficiency of photo generated carriers in the thick N$^{--}$ epilayer, even under a relatively low reverse bias. An ordinary zero-layer photo mask may be used for the definition of appropriate alignment marks (not shown in the drawings).

Figure 4:
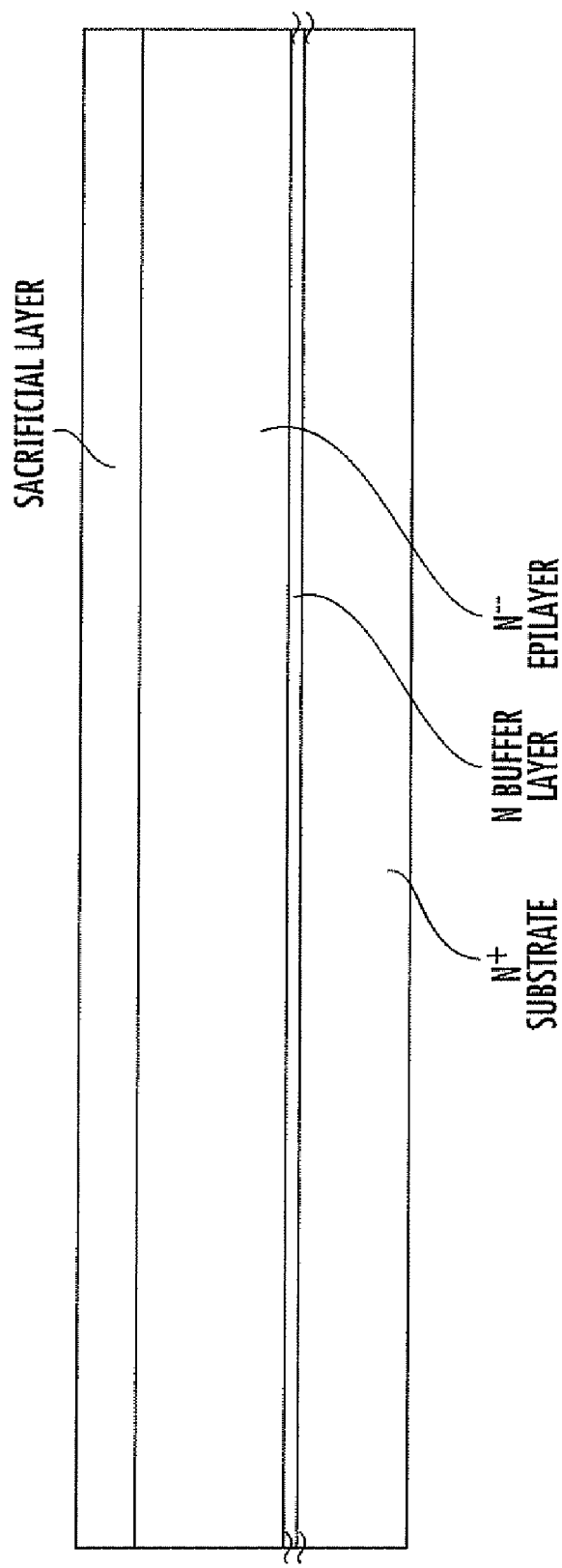

Then, as depicted in FIG. 4, a thick layer acting as sacrificial layer, typically a dielectric (e.g. SiO$_2$ or Si$_3$N$_4$) on silicon or a metal (e.g. Ni, Cr, Al) on 4H-SiC is deposited (or sputtered in the case of metal) on the wafer. The thickness of this layer may be in the range 1-10 µm, depending on the depth of the trenches to be etched in the semiconductor epilayer 14.

Figure 5:
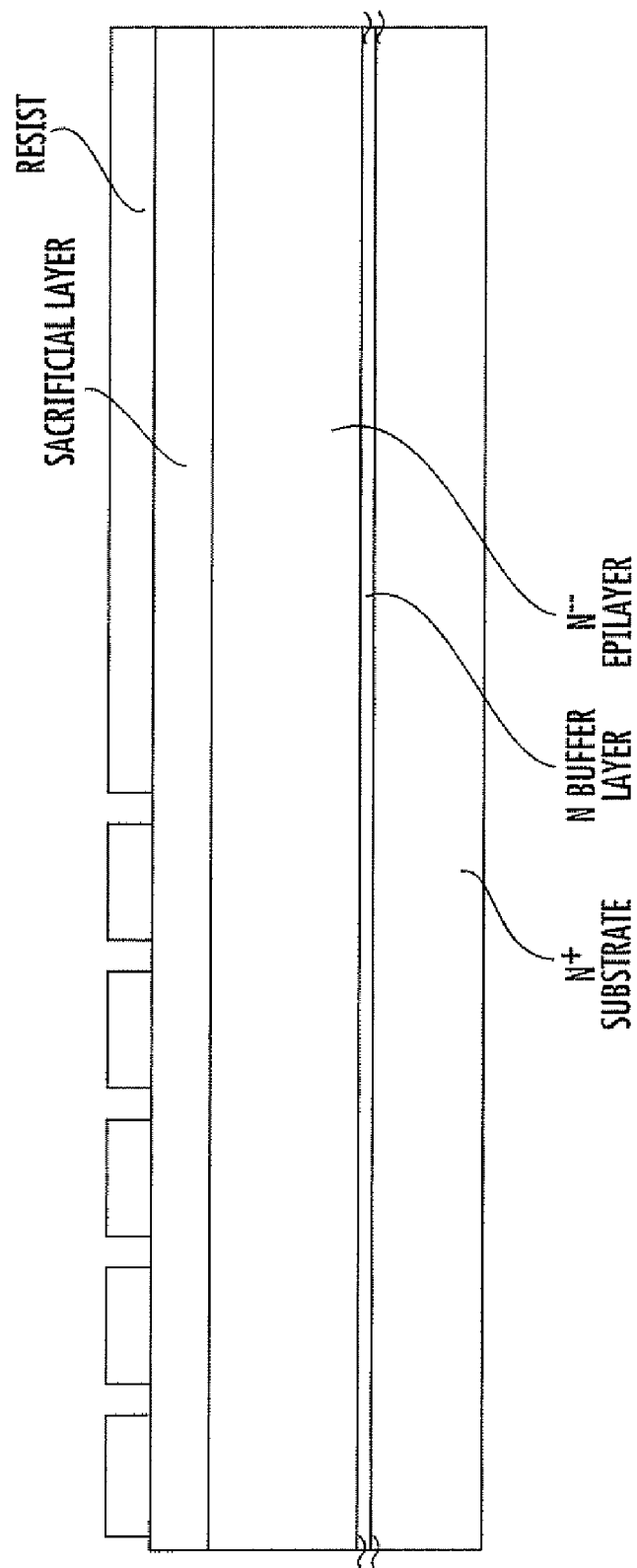
Figure 6:
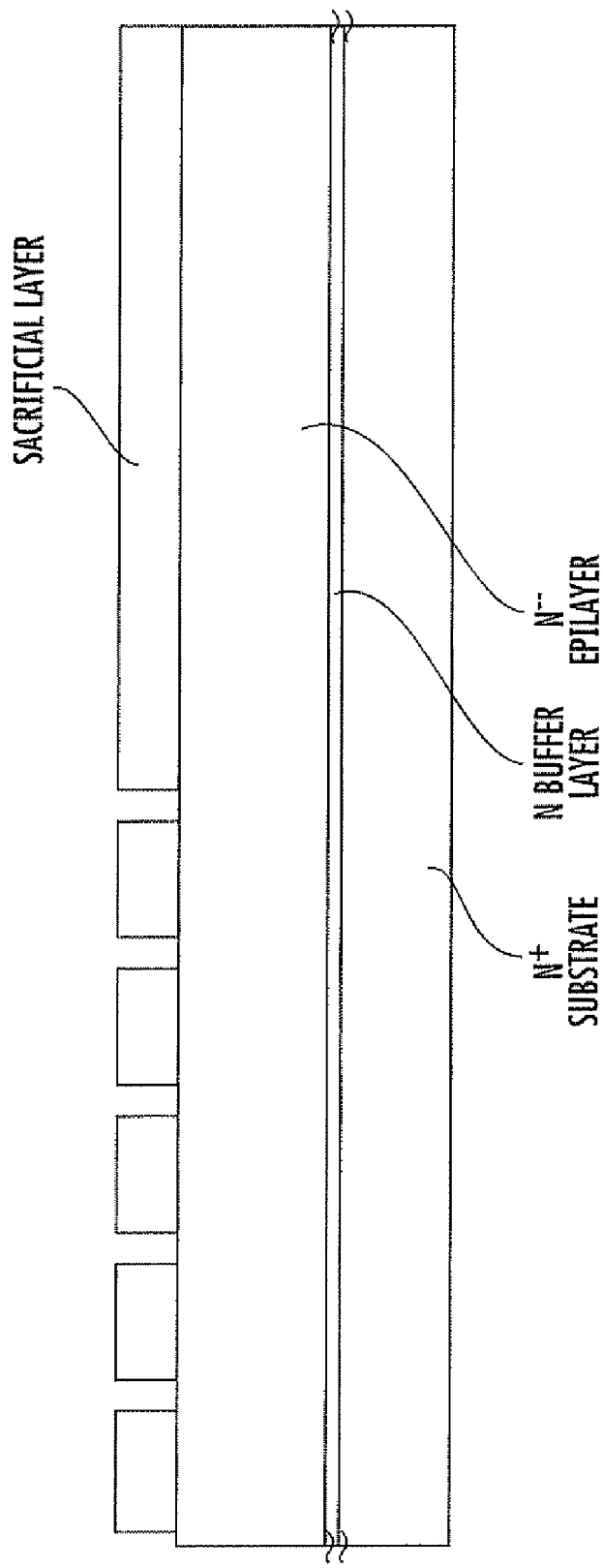
Figure 7:
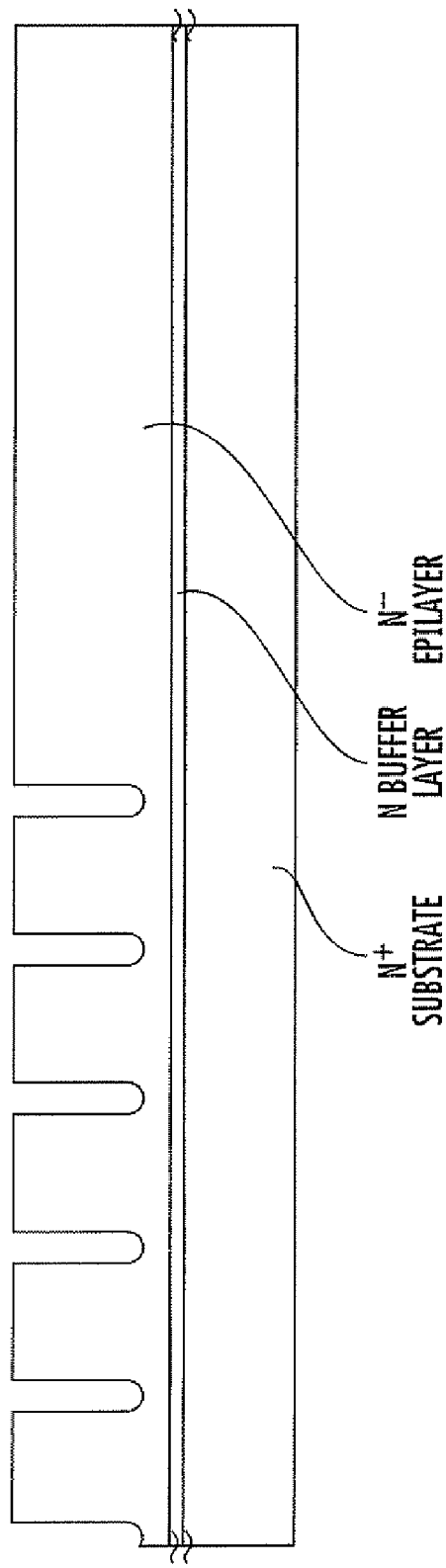

By a common lithography mask of photoresist, equally spaced trenches are defined along one side of one of the two adjacent photodiodes while in this phase the sacrificial layer onto the surface of the second photodiode remains protected by the photoresist, as depicted in FIG. 5. Using a calibrated etch process (dry or wet), the sacrificial layer is removed from areas where distributed anode trench contacts of the first photodiode will be etched, as shown in FIG. 6.

Figure 8:
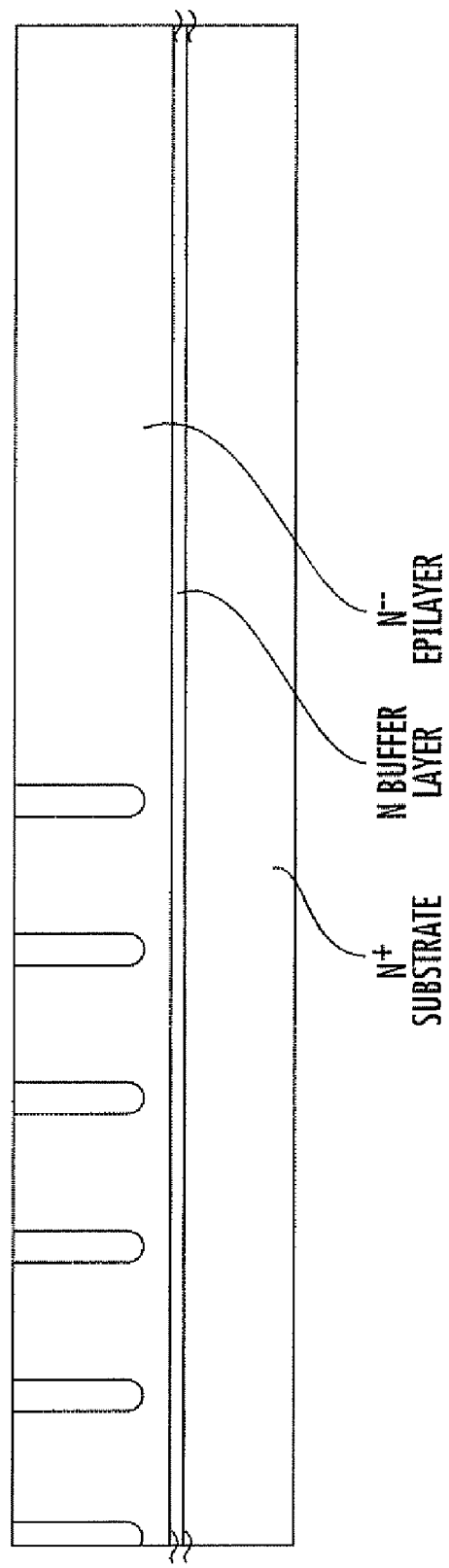
Figure 9:
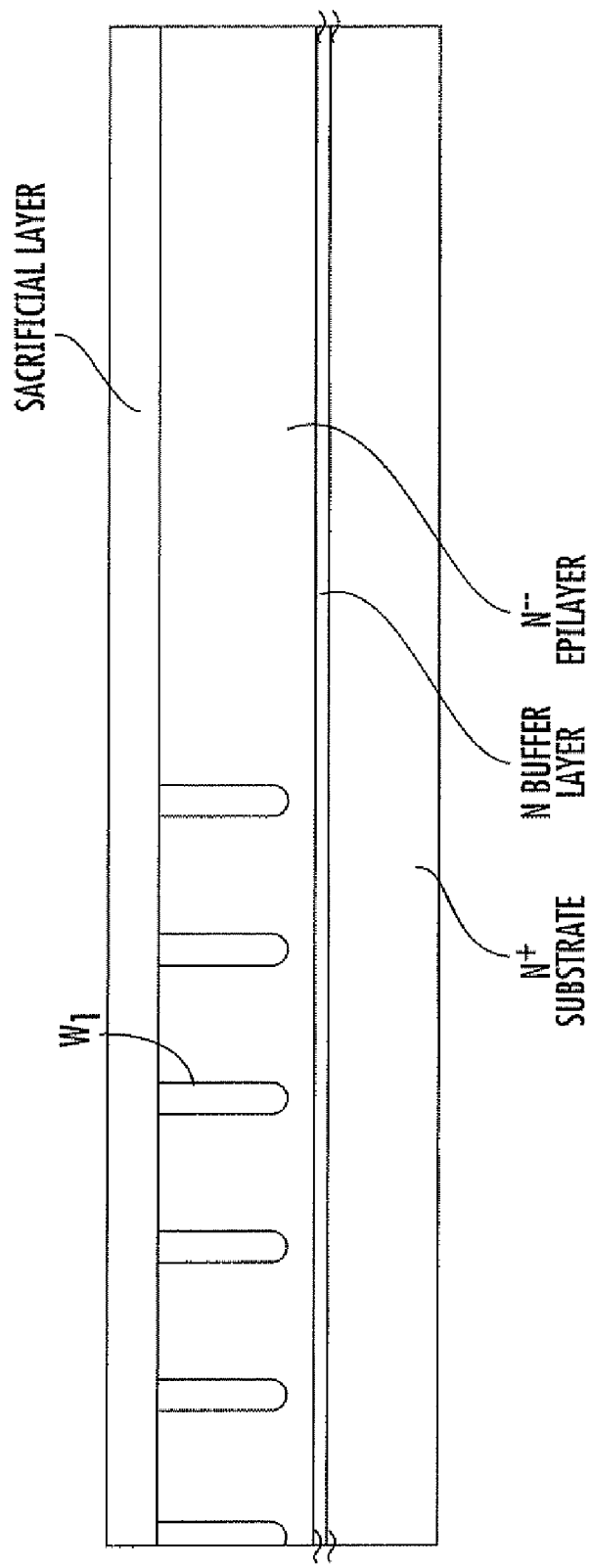
Figure 10:
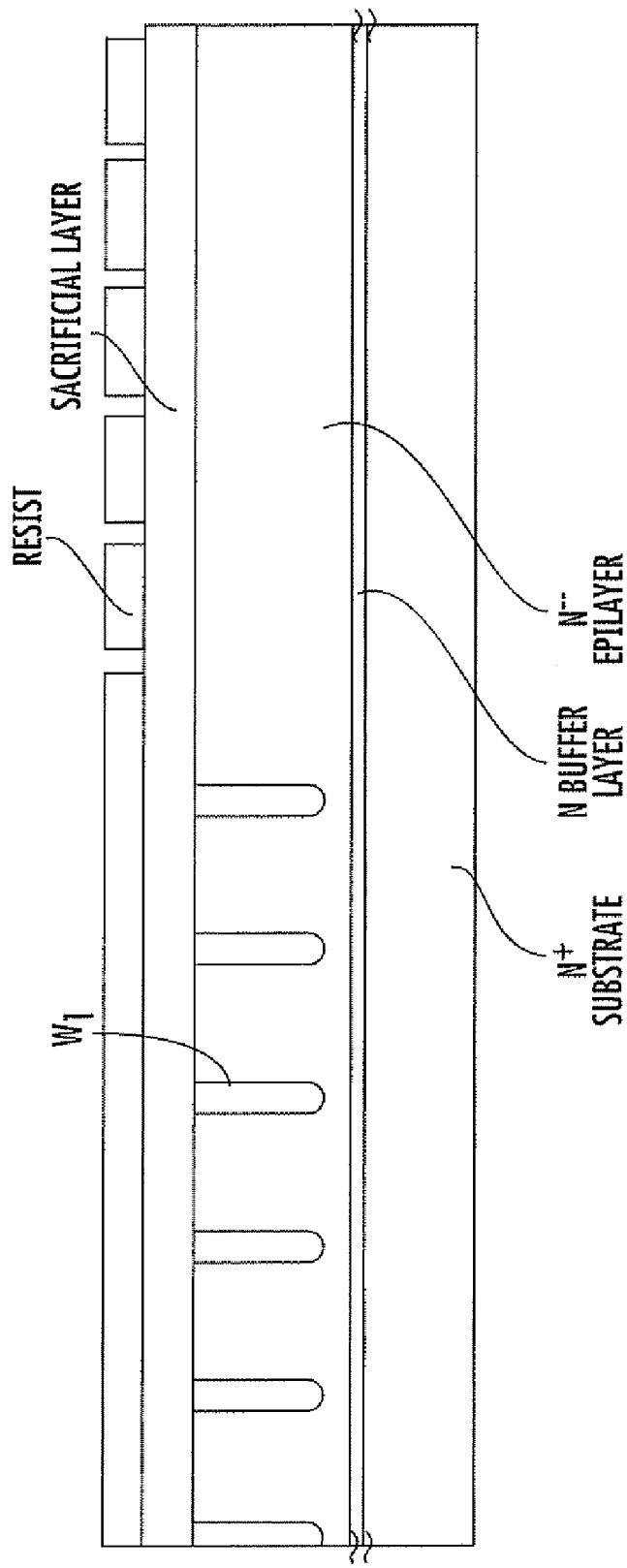
Figure 11:
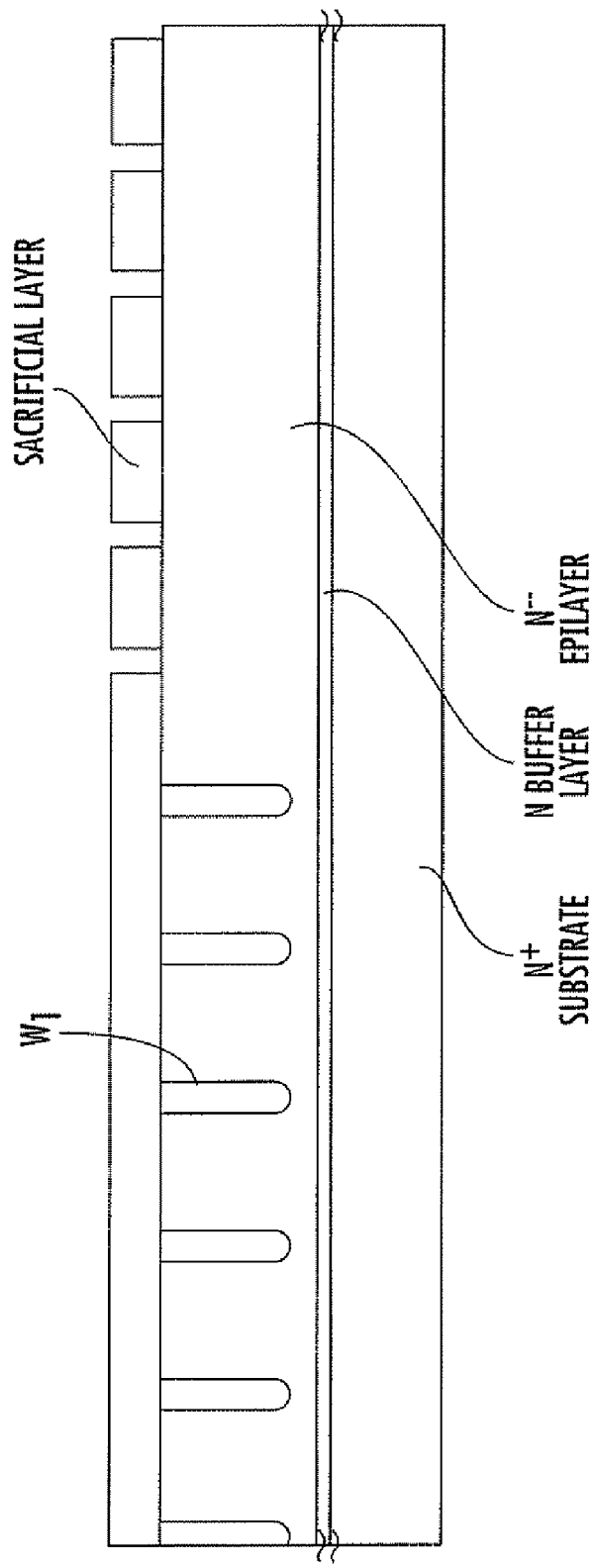
Figure 12:
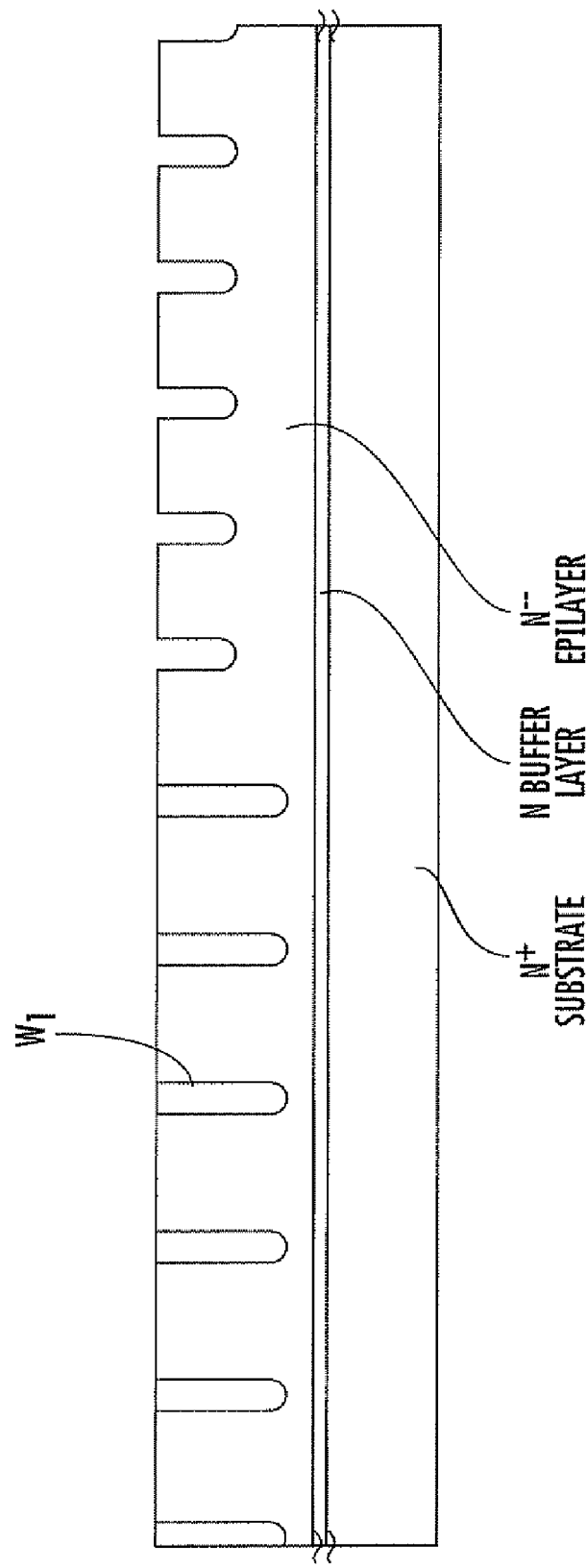
Figure 13:
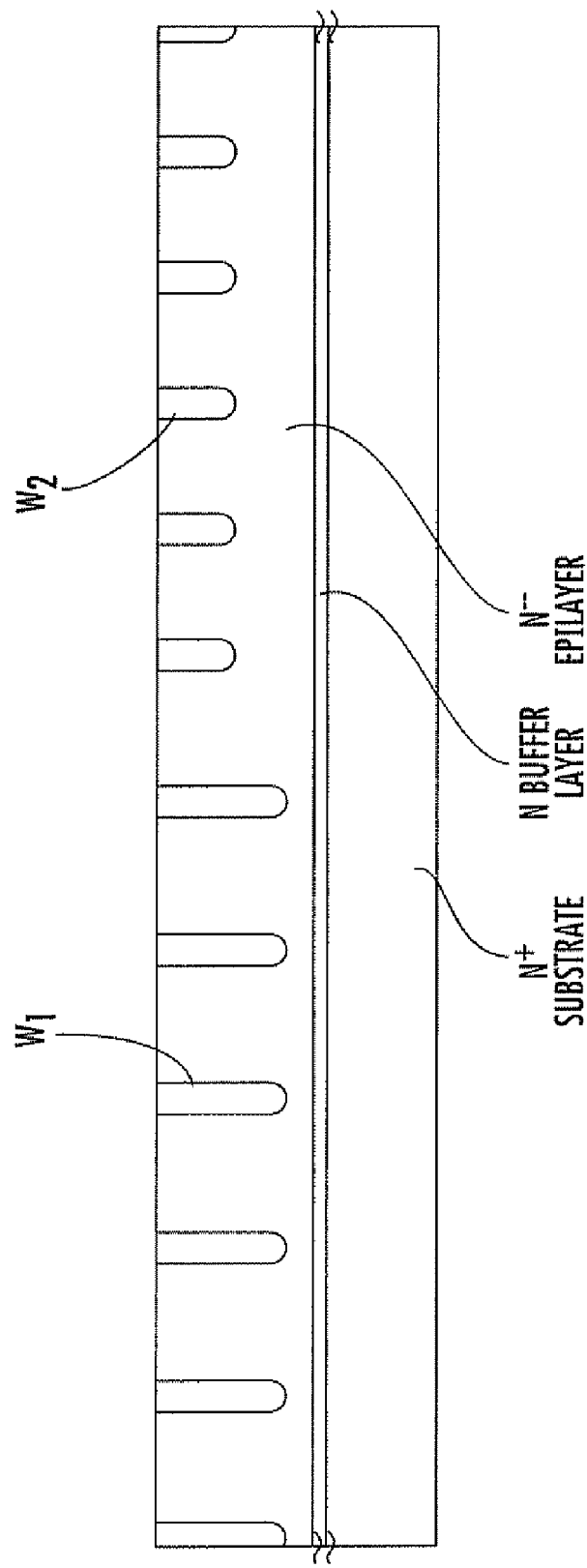

After removing the photoresist mask, with a specific and calibrated dry etch, deep trenches are cut into the semiconductor, in the area of the first photodiode. During this step, the sacrificial layer acts as hard mask protecting from the etch the semiconductor epilayer 14 in the area among the uniformly spaced trenches of the first photodiode being etched and the wholly the epilayer 14 in what will be the area of the adjacent second photodiode. The depth of etched trenches in the first photodiode, as exemplarily shown in FIG. 7, may be at most equal to the thickness of the lightly doped second epitaxial layer 14. In any case, the trenches to be filled with the selected high barrier metal to constitute the distributed anode contact of the Schottky photodiode, generally must not reach as far down as to cause a short circuit with the ohmic cathode contact on the bottom of the wafer by a common metallization. After having removed the residual sacrificial layer typically with a wet etch, a metal (usually tungsten) 16' is deposited with a CVD process to completely fill the trenches followed by an etch back to remove the metal from the planar surface, as shown in FIG. 8.

The whole sequence of steps, from the sacrificial layer deposition as far as to the filling of the trenches with the selected high barrier metal, is repeated to form the distributed anode trench contacts 16" of the second photodiode, as shown in the sequence from FIG. 9 to FIG. 13. The sequence of steps is repeated for as many times as the number of pixels of distinct sensitivity of the array, every time with different geometric parameters of depth of the metal filled trenches and of spacing among the trenches, according to a pre-established distribution pattern of pixels of different characteristics, to form a multi-pixel, photo detector array of appropriate size for producing a single monochromatic image or simultaneous monochromatic images of illuminated objects or of a source of monochromatic photons and similar imaging applications with photon fluxes of wavelength falling in the high-wavelength end portion of the sensitivity range of the semiconductor used, where conditions exist for implementing a fine adaptation of the absorption characteristics of the array pixels to be discriminately read under an impinging flux of monochromatic photons. Notably, in case of a wavelength falling in the short wavelength region of the spectrum, absorption in the depleted region of a semiconductor device of the impinging radiation may be complete in one or few microns of travel, and may be impossible to achieve a sufficient discrimination of photoelectric conversion yields of the array pixels.

Figure 14:
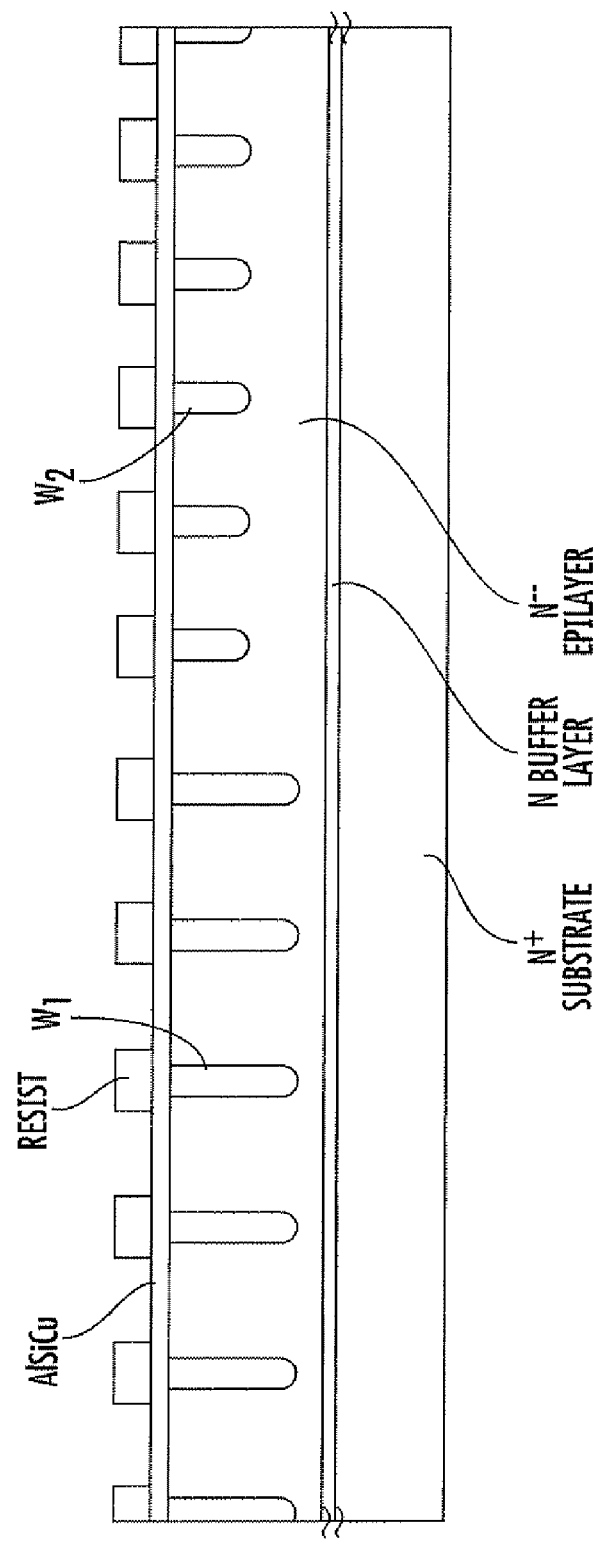
Figure 15:
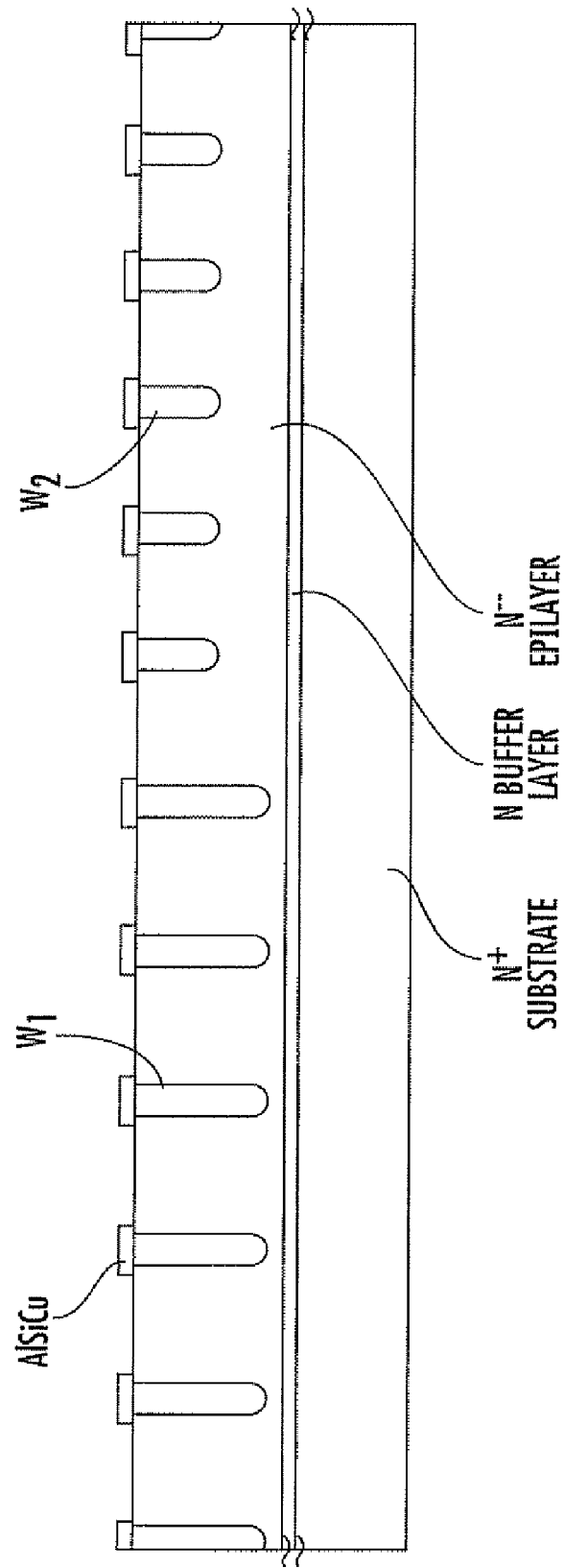

Equipotentiality of the Schottky metal filler of the trenches of distributed anode contact of the pixel photodiodes of the array is provided by an anode current collecting metal grid 18, for example, an Al—Si—Cu ternary mixture/alloy sputtered over the front surface and lithographically defined to form capping lines over and in electrical contact with the Schottky metal filler 16' and 16" of the trenches, as depicted in FIG. 14 and FIG. 15. The Al—Si—Cu ternary mixture/alloy can be sputtered on the wafer for a final thickness that may be in the range of 1-3 μm, and by ordinary photolithography and calibrated wet etch process, the metal is removed from the planar surface of the wafer, in the areas of separation among the trenches, in the pixels of the array.

Figure 16:
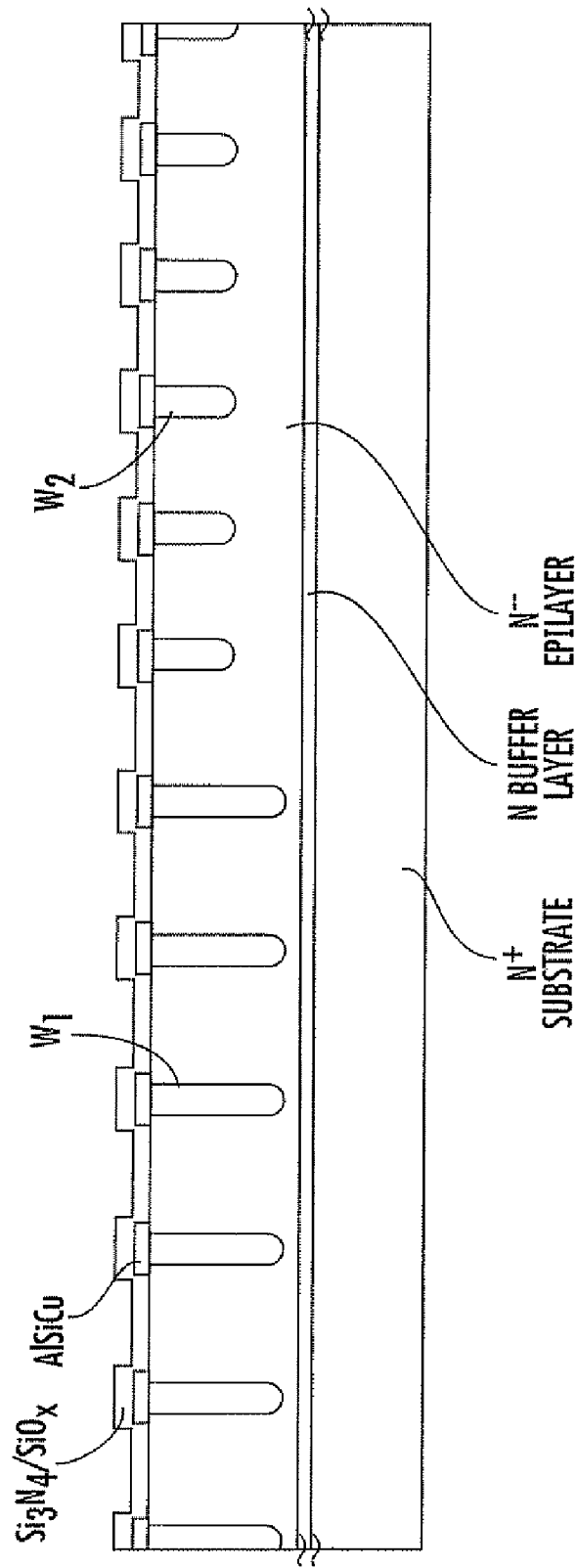
Figure 17:
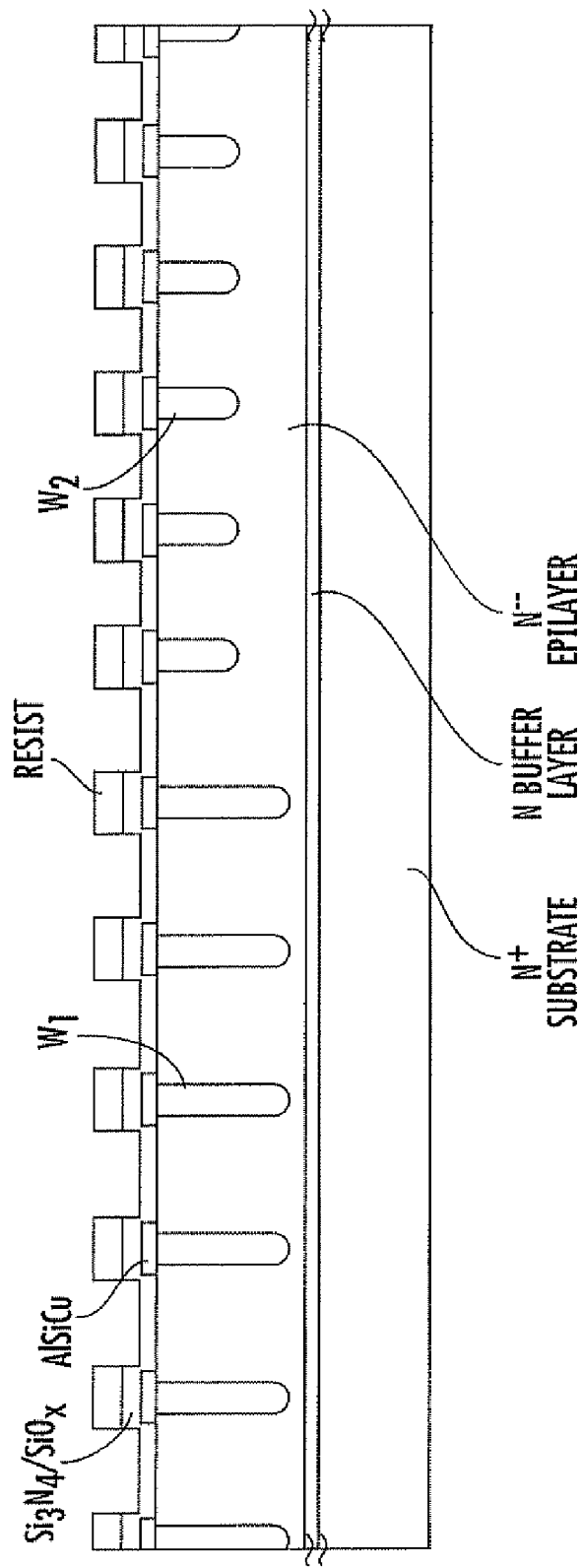
Figure 18:
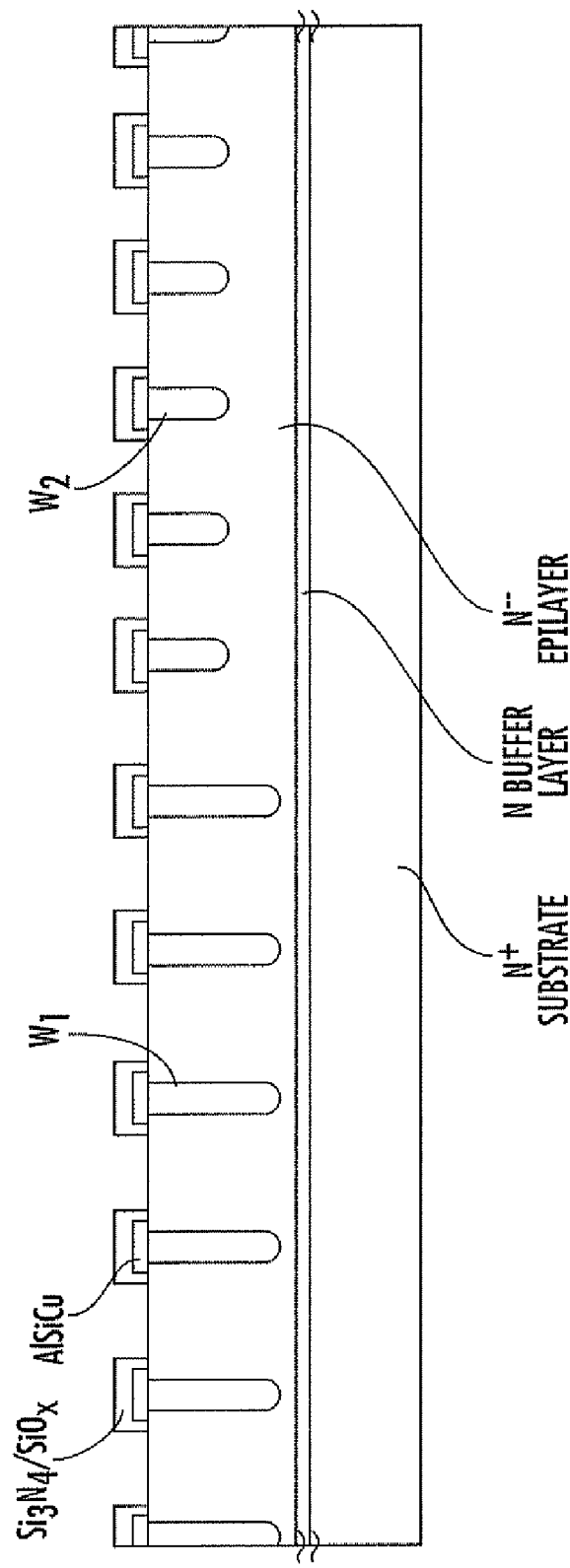

A common dielectric passivating layer 20, for example, a partly oxidized silicon nitride layer may then be deposited, as shown in FIG. 16, to coat the patterned anode contact metal grid structure of the multi-pixel array. The thickness may be in the range of 0.3-1 μm. With a further photolithography and dry etch sequence depicted in FIG. 17 and FIG. 18, the passivating layer 20 is patterned to entirely encapsulate the patterned metal parts of the anode contact metal grid structure. A sintering treatment at a relatively low temperature in hydrogen can be carried out to reduce surface electronic states concentration, and consequently, the SRH generation rate and the leakage current of the photodiodes.

Figure 19:
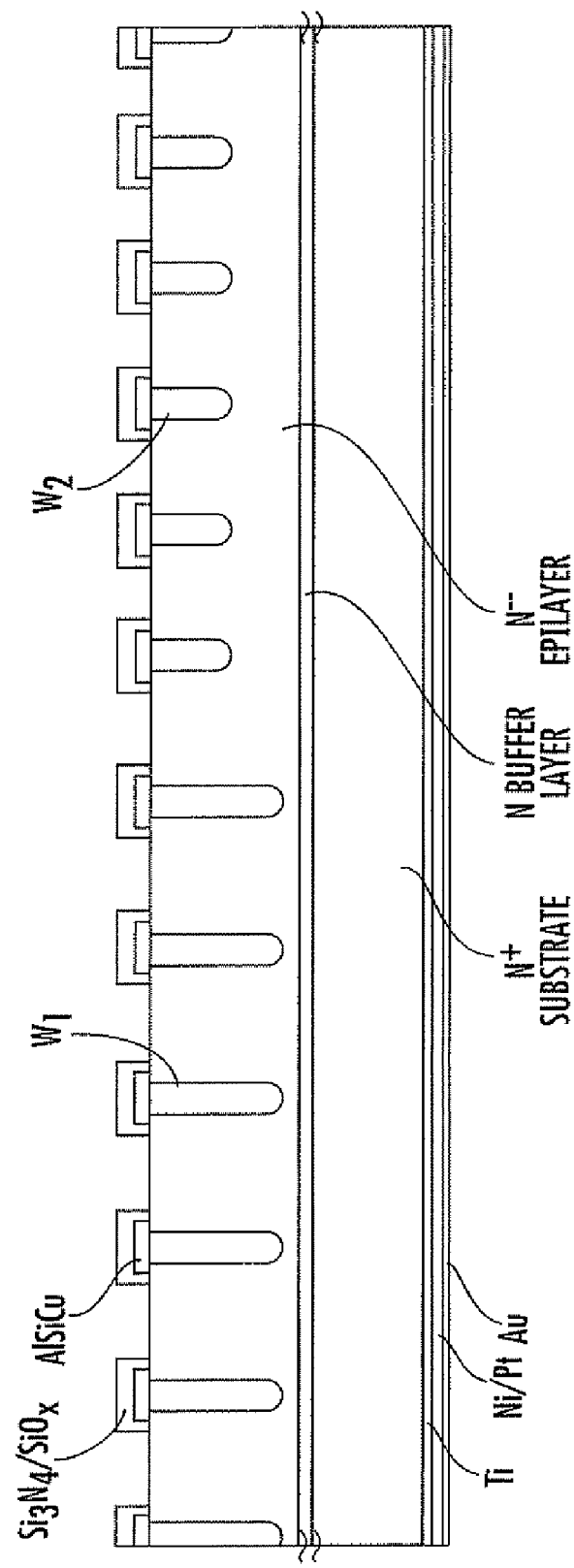

Finally, a metallic multilayer stack is deposited on the back surface of the wafer to form a bottom ohmic cathode contact common to all the array photodiodes that are thus electrically connected in parallel to the two-terminals of the array. Referring to FIG. 19, three different metallic layers can be sputtered in sequence on the back of the wafer. The first layer 22 may be, as usual, titanium, for providing an interface barrier with the semiconductor heavily doped substrate 10. The second layer 24 may be nickel, or more infrequently platinum, and the topping layer 26 may be a flash layer of gold for promoting low resistance wire bonding. The thickness of the layer 22 can be in the range 500-1000 Å, that of the second layer 24 in the range 2000-5000 Å, and that of the layer 26 can be in the range 200-500 Å.

The different sensitivities of the pixels intended in terms of different photoelectric conversion yields of the incident monochromatic photon flux, determined by the different thickness of the depletion layer that is created in each array pixel, provides the information about the point of absorption of the photons over the sensible area of the multi-pixel array. Due to the multiplexed anode contact configuration, the pixel photodiodes of the array are electrically in parallel and work at the same reverse bias condition. Therefore, the different response of each pixel to the incident photon flux is exclusively due to the different depletion layer thickness and not to different bias conditions.

Different semiconductors, such as for example silicon, silicon carbide and gallium nitride, can be used for making the solid-state photo detector array of this disclosure, while metals like tungsten, aluminum, and nickel may be used to fill the trenches for forming the distributed Schottky trench anode contact of the pixel photodiodes.

That which is claimed:

1. A method of making a multi-pixel, photo detector array of Schottky photodiodes on a semiconductor substrate having a dopant concentration between $10^{18}$ and $10^{19}$ atoms/cm$^3$, comprising:
    a) growing a first relatively thin epitaxial layer with a dopant concentration between $10^{17}$ and $10^{18}$ atoms/cm$^3$ of a same conductivity type as a dopant of the substrate, on a front side thereof;
    b) growing a second relatively thick epitaxial layer with a dopant concentration between $10^{13}$ and $10^{15}$ atoms/cm$^3$ of same conductivity type as the dopant of the substrate and a thickness between 3 and 150 μm, over the first relatively thin epitaxial layer;
    c) depositing a sacrificial metal hardmask layer;
    d) defining an array of uniformly spaced parallel openings through the sacrificial metal hardmask layer by a first lithography step of a given spacing and width of the uniformly spaced parallel openings;
    e) anisotropically etching the second relatively thick epitaxial layer through the uniformly spaced parallel openings of the metal hardmask layer, forming trenches of a given depth, and removing residual metal of the metal hardmask layer;
    f) depositing a metal layer of Schottky contact by a conformal metal deposition technique for completely filling the trenches, and etching the deposited metal layer for removing it from a planar front surface;
    g) repeating steps c) d) e) and f) for each other pixel of the array for as many different depths of the metal filled trench contacts as the number of pixels of the array of respective spacing and width of the metal filled trenches;
    h) depositing a metal layer on the planer front surface in contact with the Schottky contact metal filler of all the trenches of all the array pixels;
    i) defining a common anode current distributor grid from the deposited metal layer for connecting, in common, the Schottky contact metal filler of all the trenches and forming a connectable anode terminal pad, by a second lithography step and selective wet etch process;
    j) depositing a passivating layer conformally over the planar front surface for coating the defined parts of the metal layer;
    k) removing the passivating layer in areas of separation among coated parallel stripes of the common anode current distributor defined over the metal filled trenches by a third lithography step and dry etch process; and
    l) depositing a metallization layer over the rear surface of the semiconductor substrate to define a connectable cathode terminal.

2. The method of claim 1, further comprising performing a sintering process for reducing a concentration of surface electronic states.

3. The method of claim 1, wherein the substrate and the first relatively thin epitaxial layer and second relatively thick epitaxial layers comprise nitrogen doped silicon carbide having n-type conductivity.

4. The method of claim 1, wherein the first relatively thin epitaxial layer has thickness between 0.5 and 1.0 μm.

5. The method of claim 1, wherein the Schottky contact metal filling the trenches comprises at least one of tungsten and aluminum.

6. The method of claim 1, wherein the rear metallization layer comprises a first barrier layer of titanium, an intermediate layer of at least one of nickel and platinum, and a top layer of gold.

7. A method of making a multi-pixel, photo detector array of Schottky photodiodes on a semiconductor substrate having a dopant concentration between $10^{18}$ and $10^{19}$ atoms/cm$^3$, comprising:
    a) forming a first relatively thin epitaxial layer with a dopant concentration between $10^{17}$ and $10^{18}$ atoms/cm$^3$ of a same conductivity type as a dopant of the substrate, on a front side thereof;
    b) forming a second relatively thick epitaxial layer with a dopant concentration between $10^{13}$ and $10^{15}$ atoms/cm$^3$ of same conductivity type as the dopant of the substrate and a thickness between 3 and 150 μm, over the first relatively thin epitaxial layer;
    c) forming a sacrificial mask layer;

d) forming an array of uniformly spaced parallel openings through the sacrificial mask layer by a first lithography step of a given spacing and width of the uniformly spaced parallel openings;

e) etching the second relatively thick epitaxial layer through the uniformly spaced parallel openings of the mask layer, forming trenches of a given depth, and removing residual portions of the mask layer;

f) forming a metal layer of Schottky contact filling the trenches;

g) repeating steps c) d) e) and f) for each other pixel of the array for as many different depths of the metal filled trench contacts as the number of pixels of the array of respective spacing and width of the metal filled trenches;

h) forming a metal layer on the planer front surface in contact with the Schottky contact metal filler of the trenches of all the array pixels;

i) forming a common anode current distributor grid for connecting, in common, the Schottky contact metal filler of the trenches;

j) forming a passivating layer over the planar front surface for coating the defined parts of the metal layer;

k) removing the passivating layer in areas of separation among coated parallel stripes of the common anode current distributor grid; and l) forming a metallization layer over the rear surface of the semiconductor substrate to define a connectable cathode terminal.

8. The method of claim 7, further comprising performing a sintering process for reducing a concentration of surface electronic states.

9. The method of claim 7, wherein the substrate and the first relatively thin epitaxial layer and second relatively thick epitaxial layers comprise nitrogen doped silicon carbide having n-type conductivity.

10. The method of claim 7, wherein the first relatively thin epitaxial layer has thickness between 0.5 and 1.0 μm.

11. The method of claim 7, wherein the Schottky contact metal filling the trenches comprises at least one of tungsten and aluminum.

12. The method of claim 7, wherein the rear metallization layer comprises a first barrier layer of titanium, an intermediate layer of at least one of nickel and platinum, and a top layer of gold.

13. A method of making a multi-pixel photo detector array comprising:
  forming a plurality of Schottky photodiodes on a semiconductor substrate, each Schottky photodiode comprising a plurality of metal filled anode contacts having a depth different than a depth of metal filled anode contacts of at least one other Schottky photodiode;
  forming a common cathode coupled to the plurality of Schottky photodiodes; and
  forming a common anode collecting grid coupled to the plurality of metal filled anode contacts.

14. The method of claim 13, wherein the common cathode contact comprises a non-patterned rear metallization layer.

15. The method of claim 13, wherein each of the plurality of Schottky pixel photodiodes has a different depletion layer depth.

16. The method of claim 13, wherein the plurality of Schottky metal filled anode contacts for a given one of the plurality of Schottky pixel photodiodes has a uniform spacing therebetween.

* * * * *